(12) United States Patent
Keshav et al.

(10) Patent No.: US 8,778,762 B2
(45) Date of Patent: Jul. 15, 2014

(54) METHODS OF FORMING VERTICALLY-STACKED STRUCTURES, AND METHODS OF FORMING VERTICALLY-STACKED MEMORY CELLS

(71) Applicant: Micron Technology, Inc., Boise, ID (US)

(72) Inventors: Saurabh Keshav, Boise, ID (US); Scott Pook, Meridian, ID (US); Fatma Arzum Simsek-Ege, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/708,789

(22) Filed: Dec. 7, 2012

(65) Prior Publication Data

US 2014/0162418 A1 Jun. 12, 2014

(51) Int. Cl.
*H01L 21/336* (2006.01)

(52) U.S. Cl.
USPC ............ 438/268; 438/264; 438/269; 257/324

(58) Field of Classification Search
USPC ................. 438/257, 264, 268, 269, 702, 703; 257/324, 325, 326, E21.232, E21.423, 257/314
See application file for complete search history.

(56) References Cited

U.S. PATENT DOCUMENTS

| | | | |
|---|---|---|---|
| 6,057,193 A | 5/2000 | Wang et al. | |
| 6,143,604 A | 11/2000 | Chiang et al. | |
| 6,180,454 B1 | 1/2001 | Chang et al. | |
| 6,274,471 B1 | 8/2001 | Huang | |
| 6,353,242 B1 | 3/2002 | Watanabe et al. | |
| 6,661,691 B2 | 12/2003 | Fricke et al. | |
| 6,803,318 B1 | 10/2004 | Qiao et al. | |
| 7,112,488 B2 | 9/2006 | Helm et al. | |
| 7,196,004 B2 | 3/2007 | Lee et al. | |
| 7,419,895 B2 | 9/2008 | Lindsay | |
| 7,713,819 B2 | 5/2010 | Okajima | |
| 7,898,856 B2 | 3/2011 | Aritome | |
| 7,906,818 B2 | 3/2011 | Pekny | |
| 7,968,406 B2 | 6/2011 | Ramaswamy et al. | |
| 8,148,216 B2 | 4/2012 | Arai et al. | |
| 8,183,110 B2 | 5/2012 | Ramaswamy et al. | |
| 8,237,213 B2 | 8/2012 | Liu | |
| 8,278,695 B2 | 10/2012 | Kidoh et al. | |

(Continued)

OTHER PUBLICATIONS

U.S. Appl. No. 13/675,933, filed Nov. 13, 2012, by Davis et al.

(Continued)

*Primary Examiner* — Charles Garber
*Assistant Examiner* — Syed Gheyas
(74) *Attorney, Agent, or Firm* — Wells St. John P.S.

(57) ABSTRACT

Some embodiments include methods of forming vertically-stacked structures, such as vertically-stacked memory cells. A first hardmask is formed over a stack of alternating electrically conductive levels and electrically insulative levels. A first opening is formed through the first hardmask and the stack. Cavities are formed to extend into the electrically conductive levels. A fill material is formed within the first opening and within the cavities. A second hardmask is formed over the first hardmask and over the fill material. A second opening is formed through the second hardmask. The second opening is narrower than the first opening. The second opening is extended into the fill material to form an upwardly-opening container from the fill material. Sidewalls of the upwardly-opening container are removed, while leaving the fill material within the cavities as a plurality of vertically-stacked structures.

15 Claims, 6 Drawing Sheets

(56) References Cited

U.S. PATENT DOCUMENTS

| | | | |
|---|---|---|---|
| 8,283,205 B2 | 10/2012 | Pagalia et al. | |
| 8,288,811 B2 | 10/2012 | Ramaswamy | |
| 8,437,192 B2* | 5/2013 | Lung et al. | 365/185.17 |
| 8,507,976 B2* | 8/2013 | Joo | 257/326 |
| 2005/0200026 A1 | 9/2005 | Liaw | |
| 2007/0004140 A1* | 1/2007 | Jang et al. | 438/257 |
| 2007/0004141 A1 | 1/2007 | Kim et al. | |
| 2009/0117725 A1 | 5/2009 | Sun | |
| 2009/0289297 A1* | 11/2009 | Kim et al. | 257/324 |
| 2009/0296476 A1 | 12/2009 | Shin et al. | |
| 2010/0155813 A1 | 6/2010 | Murata et al. | |
| 2010/0208503 A1 | 8/2010 | Kuo | |
| 2011/0031550 A1 | 2/2011 | Komori et al. | |
| 2011/0149656 A1 | 6/2011 | Tang et al. | |
| 2011/0177661 A1 | 7/2011 | Song et al. | |
| 2011/0180865 A1 | 7/2011 | Ramaswamy | |
| 2011/0193153 A1* | 8/2011 | Higuchi et al. | 257/324 |
| 2011/0241098 A1 | 10/2011 | Park et al. | |
| 2012/0086072 A1 | 4/2012 | Yun et al. | |
| 2012/0119285 A1 | 5/2012 | Yang | |
| 2012/0193596 A1 | 8/2012 | Nakazawa | |
| 2012/0217564 A1 | 8/2012 | Tang et al. | |
| 2012/0231593 A1* | 9/2012 | Joo et al. | 438/264 |
| 2012/0329224 A1* | 12/2012 | Kong et al. | 438/268 |

OTHER PUBLICATIONS

U.S. Appl. No. 13/735,908, filed Jan. 7, 2013, by Hopkins.
U.S. Appl. No. 13/738,147, filed Jan. 10, 2013, by Thimmegowa et al.
U.S. Appl. No. 13/748,747, filed Jan. 24, 2013, by Hopkins et al.
U.S. Appl. No. 13/759,627, filed Feb. 5, 2013, by Thimmegowa et al.
U.S. Appl. No. 13/894,481, filed May 5, 2013, by Ramaswamy.
U.S. Appl. No. 13/894,631, filed May 5, 2013, by Ramaswamy.

* cited by examiner

US 8,778,762 B2

METHODS OF FORMING VERTICALLY-STACKED STRUCTURES, AND METHODS OF FORMING VERTICALLY-STACKED MEMORY CELLS

TECHNICAL FIELD

Methods of forming vertically-stacked structures, and methods of forming vertically-stacked memory cells.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

A typical flash memory comprises a memory array that includes a large number of memory cells arranged in row and column fashion. The flash memory may be erased and reprogrammed in blocks.

NAND may be a basic architecture of flash memory. A NAND cell unit comprises at least one selecting device coupled in series to a serial combination of memory cells (with the serial combination commonly being referred to as a NAND string). Example NAND architecture is described in U.S. Pat. No. 7,898,850.

There is continuing goal to develop improved NAND architectures, and to develop methods of forming such NAND architectures.

DETAILED DESCRIPTION OF THE ILLUSTRATED EMBODIMENTS

In some embodiments, new processing is utilized to form vertically-stacked structures, such as, for example, vertically-stacked memory cells. In some embodiments, the vertically-stacked memory cells may be incorporated into NAND. Some example embodiments are described with reference to FIGS. 1-11.

Figure 1:
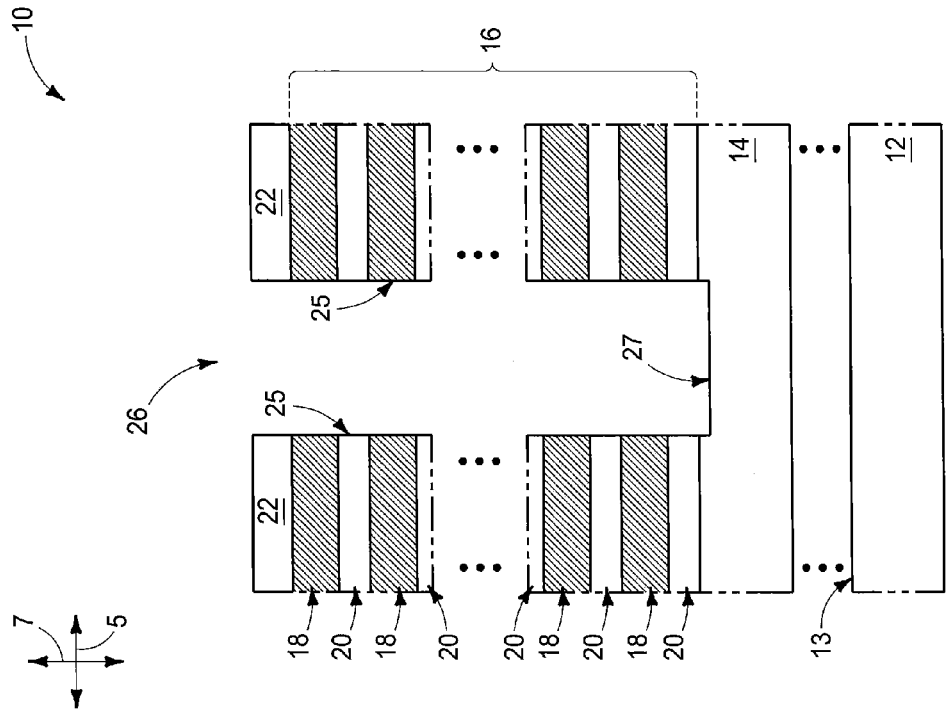
FIGS. 1-11 are diagrammatic cross-sectional views of a region of a semiconductor construction shown at various stages of an example embodiment process for forming an example embodiment construction.

Referring to FIG. 1, a semiconductor construction 10 includes an etchstop material 14 supported by a base 12. A break is provided between the etchstop material 14 and the base 12 to indicate that there may be additional materials and/or integrated circuit structures between the base and the etchstop material in some embodiments.

The base 12 may comprise semiconductor material, and in some embodiments may comprise, consist essentially of or consist of monocrystalline silicon. In some embodiments, base 12 may be considered to comprise a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, base 12 may correspond to a semiconductor substrate containing one or more materials associated with integrated circuit fabrication. Such materials may include, for example, one or more of refractory metal materials, barrier materials, diffusion materials, insulator materials, etc.

The etchstop material 14 may comprise any suitable composition or combination of compositions; and in some embodiments may comprise, consist essentially of, or consist of aluminum oxide.

A stack 16 of alternating electrically conductive levels 18 and electrically insulative levels 20 is formed over the etchstop material 14. The levels 16 and 18 may correspond to sheets, layers, tiers, etc.

The electrically conductive levels 18 may comprise any suitable electrically conductive material; and in some embodiments may comprise, consist essentially of, or consist of one or more of various metals (for example, tungsten, titanium, etc.), metal-containing compositions (for example, metal nitride, metal carbide, metal silicide, etc.), and conductively-doped semiconductor materials (for example, conductively-doped silicon, conductively-doped germanium, etc.). For instance, in some embodiments the electrically conductive levels 18 may comprise, consist essentially of or consist of conductively-doped silicon; such as, for example, n-type doped polycrystalline silicon.

In some embodiments, the electrically conductive levels 18 are ultimately utilized to pattern control gates of flash devices, and in such embodiments the electrically conductive levels may be considered to comprise control gate material. Such example processing may form a vertical string of memory cells (such as, for example, a vertical NAND string of memory cells), with the number of memory cells in each string being determined by the number of electrically conductive levels 18. A break is provided within the stack 16 to indicate that there may be more levels in the stack. The stack may have any number of levels suitable to form a desired structure. For instance, in some embodiments the stack may have 8 electrically conductive levels, 16 electrically conductive levels, 32 electrically conductive gate levels, 64 of electrically conductive levels, etc.

The electrically insulative levels 20 may comprise any suitable composition; and in some embodiments may comprise, consist essentially of, or consist of silicon dioxide.

The electrically conductive levels 18 may be of any suitable thickness ($T_1$), and in some embodiments may have a thickness within a range of from about 10 nm to about 300 nm; such as, for example, a thickness of about 30 nm. The electrically insulative levels 20 may be of any suitable thickness ($T_2$), and in some embodiments may have a thickness within a range of from about 10 nm to about 300 nm; such as, for example, a thickness of about 20 nm.

In the shown embodiment, the base 12 has a substantially horizontal primary surface 13 (e.g., an upper surface of a semiconductor wafer corresponding to base 12 in some embodiments) extending along a direction of an axis 5. In some embodiments, subsequent processing (described below) may be utilized to form a vertical string of memory cells, with such vertical string extending along a direction of an axis 7 which is substantially orthogonal to the axis 5.

A hardmask material 22 is formed over stack 16, and a carbon-containing material 24 is formed over the hardmask material. In the shown embodiment the hardmask material is on an electrically conductive level 18. In other embodiments, the hardmask material 22 may be on an electrically insulative level 20.

Hardmask material 22 may comprise any suitable composition or combination of compositions; and in some embodiments may comprise, consist essentially of, or consist of silicon nitride. The hardmask material 22 may be formed to any suitable thickness, and in some example embodiments may be formed to a thickness within a range of from about 200 Å to about 600 Å; such as, for example, about 400 Å.

The carbon-containing material 24 may comprise any suitable composition or combination of compositions; and in some embodiments may comprise, consist essentially of, or consist of carbon (for instance, amorphous carbon). The carbon-containing material 24 may be formed to any suitable thickness, and in some example embodiments may be formed to a thickness within a range of from about 1000 Å to about 1600 Å; such as, for example, about 1200 Å.

The hardmask material 22 and the carbon-containing material 24 are patterned to form an opening 26 extending through the materials 22 and 24. Such patterning may be accomplished with any suitable processing. For instance, in some embodiments a patterned masking material (not shown) may be formed over carbon-containing material 24 to define a location of opening 26, the opening may then be etched through materials 22 and 24 with one or more suitable etches, and then the masking material may be removed to leave the construction of FIG. 1. The masking material may comprise any suitable composition, and in some embodiments may comprise a photolithographically-patterned photoresist mask and/or a mask formed utilizing pitch-multiplication methodologies. If the masking material comprises photolithographically-patterned photoresist, an antireflective material (not shown) may be provided over carbon-containing material 24. In some embodiments, the masking material (not shown) may remain over carbon-containing material 24 after the opening 26 is etched through the hardmask 22, and thus a patterned masking material may be over material 24 at the processing stage of FIG. 1.

Figure 2:
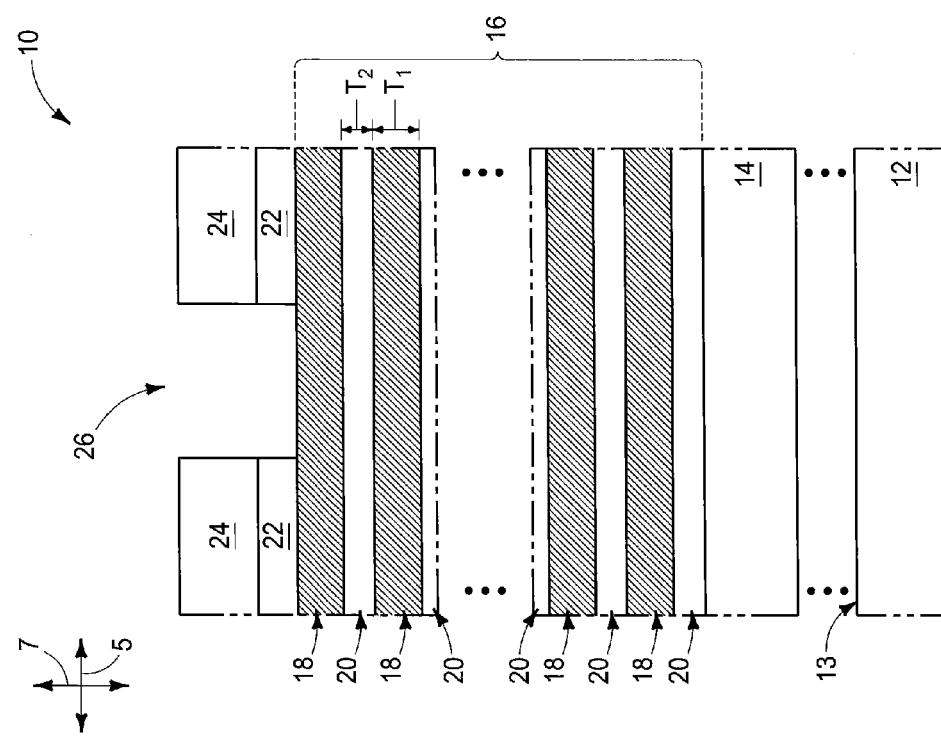

Referring to FIG. 2, the opening 26 is extended through stack 16 with one or more suitable etches. An example etch may utilize one or more of $NF_3$, $CH_2F_2$, HBr and $BCl_3$. The etch extends through stack 16 and to an upper surface of etchstop material 14. In some embodiments, the etch stops on the upper surface of etchstop material 14; and in some embodiments the etch may extend into etchstop material 14, as shown.

In the shown embodiment, the etching utilized to extend the opening 26 into stack 16 has removed carbon-containing material 24 (FIG. 1) from over hardmask 22.

Similar processing to that of FIGS. 1 and 2 may occur in some prior art fabrication processes. However, an advantage of the processing of FIGS. 1 and 2 relative to such prior art processes may be that the amount of material provided over stack 16 during the formation of opening 26 may be less in some embodiments described herein relative to the amount of material utilized in prior art processing. Such can alleviate problems encountered in prior processing. For instance, it is more difficult to maintain desired characteristics of an opening at high aspect ratios as compared to low aspect ratios. The reduction in the amount of material over stack 16 in methods of the present invention can mean that such methods are effectively forming a lower-aspect-ratio opening as compared to prior art processing having a greater overburden of material over stack 16. Such may enable processing of the present invention to form openings having better uniformity than is achieved by prior art processing, and may enable processing of the present invention to avoid defects such as bowing and twisting that may be associated with openings formed by prior art processing. Prior art processing may utilize thicker nitride-containing material and carbon-containing material as compared to the thicknesses of the materials 22 and 24 described above with reference to FIG. 1, and may utilize other materials in addition to the nitride-containing material and carbon-containing material (for instance, prior art processing may utilize oxide in addition to the nitride-containing material and carbon-containing material).

The opening 26 has sidewalls 25 extending along electrically insulative levels 20 and electrically conductive levels 18, and has a bottom 27. The opening may have any suitable shape, and may, for example, be circular or elliptical when viewed from above. In the shown embodiment, the sidewalls 25 are substantially vertical. In actual processing, such sidewalls may be tapered.

Figure 3:
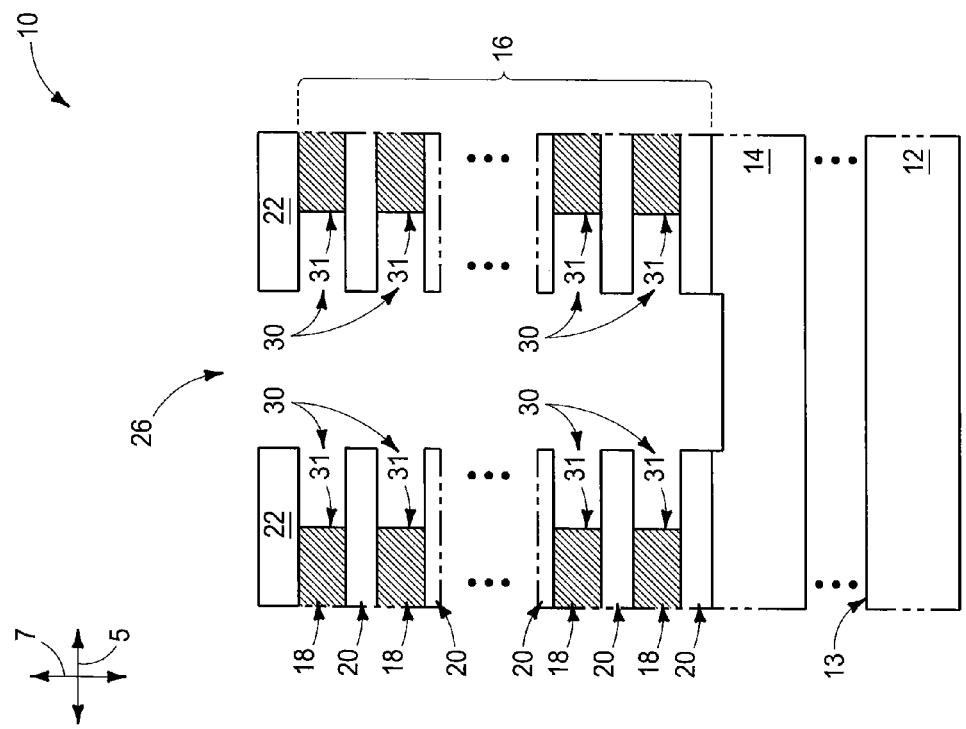

Referring next to FIG. 3, the electrically conductive levels 18 are etched along sidewalls of opening 26 to form cavities 30 extending into the conductive levels. In some embodiments, the electrically conductive levels 18 comprise polycrystalline silicon, the electrically insulative levels 20 comprise silicon dioxide, and the formation of cavities 30 utilizes isotropic etching which is substantially selective for polycrystalline silicon relative to silicon dioxide.

The electrically conductive levels 18 have exposed edges 31 within the cavities 30.

Figure 4:
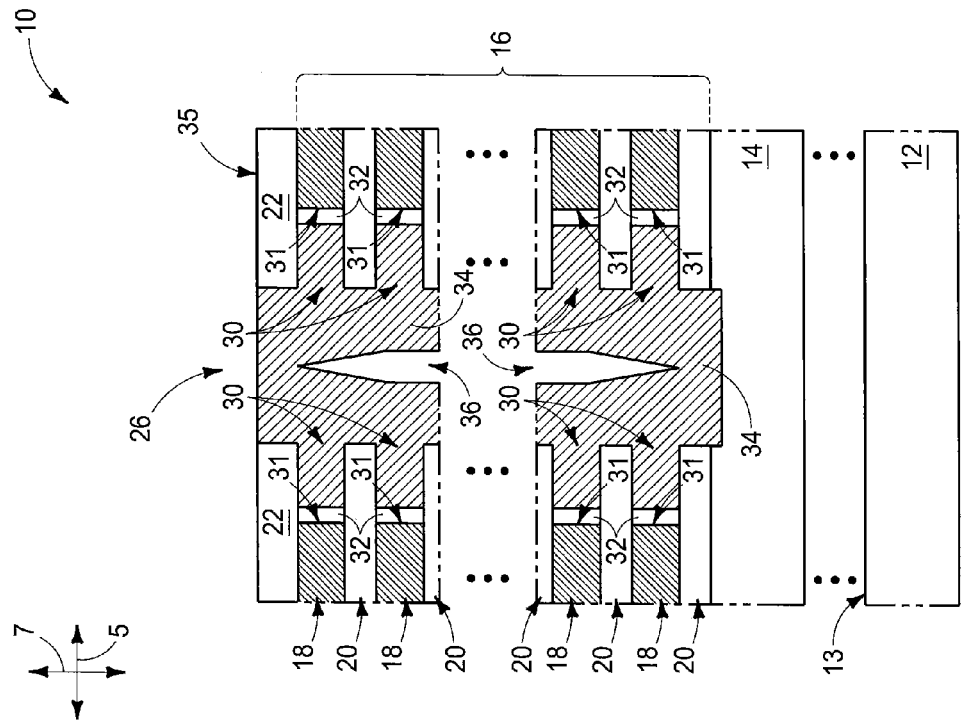

Referring to FIG. 4, blocking dielectric material 32 is formed within cavities 30 and along the exposed edges 31 of conductive levels 18. The blocking dielectric material may comprise any composition suitable for being provided between a charge-storage material (for instance, a floating gate material or a charge trapping material) and a control gate of a NAND device. Although a single blocking dielectric material is shown, in other embodiments there may be two or more blocking dielectric materials provided within the cavities. Example blocking dielectric materials are silicon nitride, silicon dioxide, hafnium oxide, zirconium oxide, etc.

Fill material 34 is provided within opening 26 to fill the opening and the cavities 30. The fill material may comprise a charge-storage material suitable for utilization as a charge-storage structure of a NAND gate. For instance, in some embodiments the fill material may comprise floating gate material (for instance, doped or undoped silicon) or charge-trapping material (for instance, silicon nitride, nanodots, etc.).

In some embodiments, the fill material entirely fills opening 26. In other embodiments, the fill material substantially entirely fills the opening. For instance, in the shown embodiment the fill material substantially entirely fills the opening, except for a vertically-extending seam 36 that extends down a central region of the fill material. The seam may be desired in some embodiments, in that it may advantageously reduce an amount of fill material removed from the opening in a subsequent step.

In the shown embodiment, a planarized surface 35 is formed across fill material 34 and hardmask material 22. Such planarized surface may be formed utilizing any suitable processing, including, for example, chemical-mechanical polishing (CMP).

Figure 5:
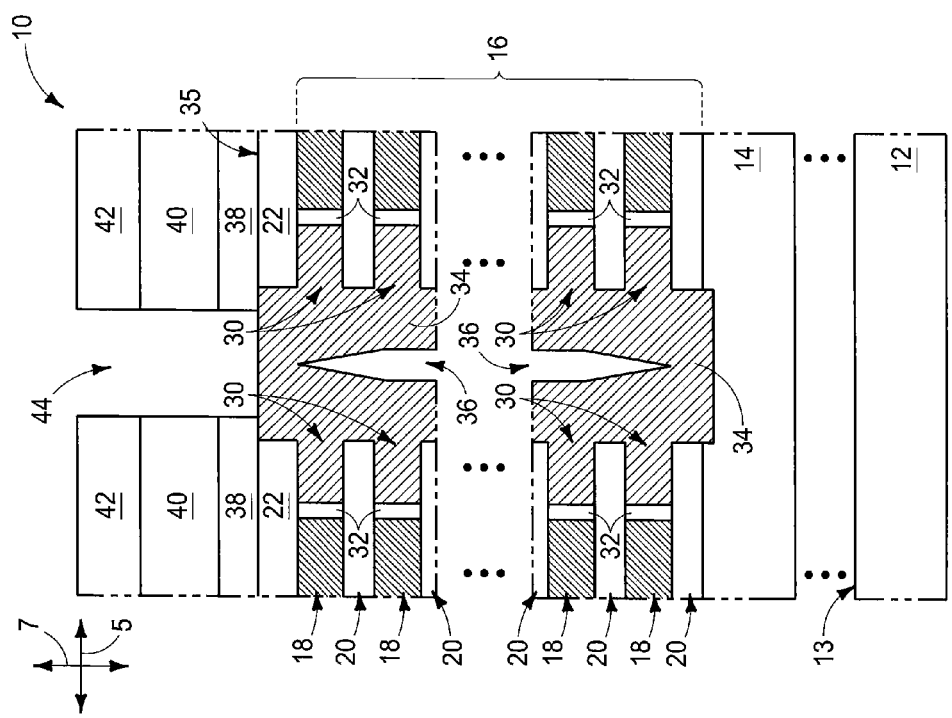

Referring to FIG. 5, a hardmask material 38 is formed over planarized surface 35. Hardmask materials 22 and 38 may be referred to as first and second hardmask materials, respectively, to differentiate such hardmask materials one another. The first and second hardmask materials 22 and 38 may comprise a same composition as one another in some embodiments. For instance, in some embodiments, both of materials 22 and 38 may comprise, consist essentially of, or consist of silicon nitride. The hardmask material 38 may be formed to any suitable thickness, and in some embodiments may be formed to a thickness within a range of from about 200 Å to about 600 Å; such as, for example, about 400 Å.

An oxide material 40 is formed over hardmask material 38. The oxide material may comprise any suitable composition or combination of compositions; and in some embodiments may comprise, consist essentially of, or consist of silicon dioxide. Such oxide material may be formed to any suitable thickness, and in some embodiments may be formed to a thickness within a range of from about 2000 Å to about 9000 Å; such as, for example, about 7000 Å.

A carbon-containing material 42 is formed over the oxide material 40. The carbon-containing material 42 may comprise any suitable composition or combination of compositions; and in some embodiments may comprise, consist essentially of, or consist of carbon (for instance, amorphous carbon). The carbon-containing material 42 may be formed to any suitable thickness, and in some embodiments may be formed to a thickness within a range of from about 2000 Å to about 16,000 Å; such as, for example, about 5000 Å. In some embodiments, the material 42 may have a thickness within a range of from about 5000 Å to about 16,000 Å.

In some embodiments, the carbon-containing materials 24 (FIG. 1) and 42 may be referred to as first and second carbon-containing materials, respectively, to differentiate such materials from one another.

The hardmask material 38, oxide material 40 and carbon-containing material 42 are patterned to form an opening 44 extending through materials 38, 40 and 42. Such patterning may be accomplished with any suitable processing. For instance, in some embodiments a patterned masking material (not shown) may be formed over carbon-containing material 42 to define a location of opening 44, the opening may then be etched through materials 38, 40 and 42 with one or more suitable etches, and then the masking material may be removed to leave the construction of FIG. 5. The masking material may comprise any suitable composition, and in some embodiments may comprise a photolithographically-patterned photoresist mask and/or a mask formed utilizing pitch-multiplication methodologies. If the masking material comprises photolithographically-patterned photoresist, an antireflective material (not shown) may be provided over carbon-containing material 42. In some embodiments, the masking material (not shown) may remain over carbon-containing material 42 after the opening 44 is etched through the hardmask 38, and thus a patterned masking material may be over material 42 at the processing stage of FIG. 5.

The openings 26 (FIG. 1) and 44 may be referred to as first and second openings, respectively, to differentiate such openings from one another. In the shown embodiment, the opening 44 is narrower than the opening 26 along the cross-sections of the figures.

Figure 6:
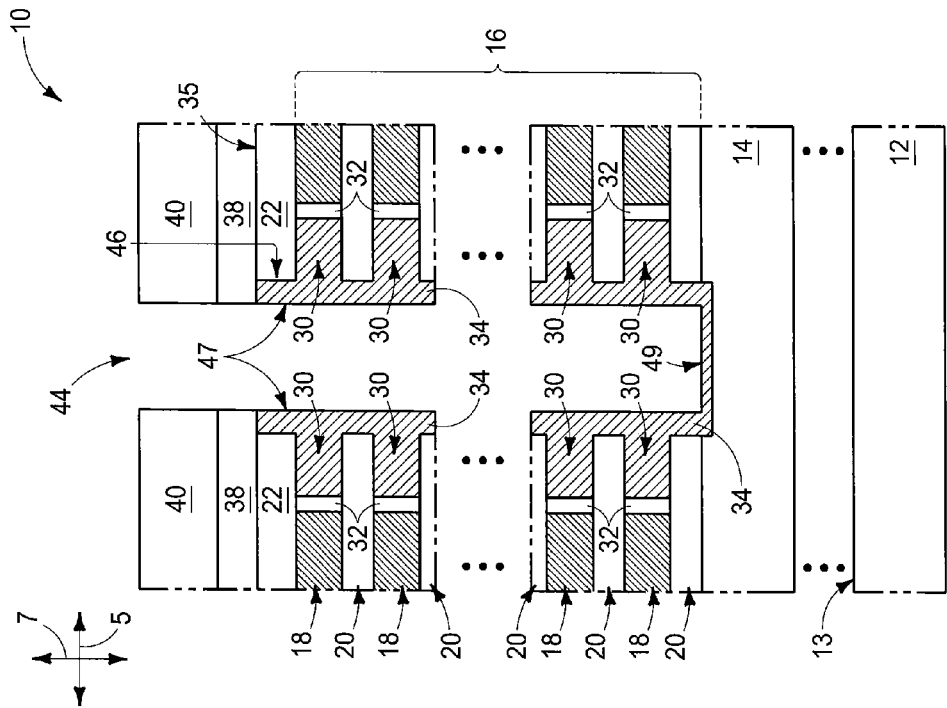

Referring to FIG. 6, opening 44 is extended into fill material 34, and such forms an upwardly-opening container 46 from the fill material. The seam 36 (FIG. 5) may advantageously reduce the amount of fill material 34 which is removed to form the container 46 as compared to other embodiments lacking such seam.

The upwardly-opening container 46 comprises sidewalls 47 and a bottom 49.

In the shown embodiment, the etching utilized to extend the opening 44 into the fill material has removed carbon-containing material 42 (FIG. 5) from over oxide material 40.

Figure 7:
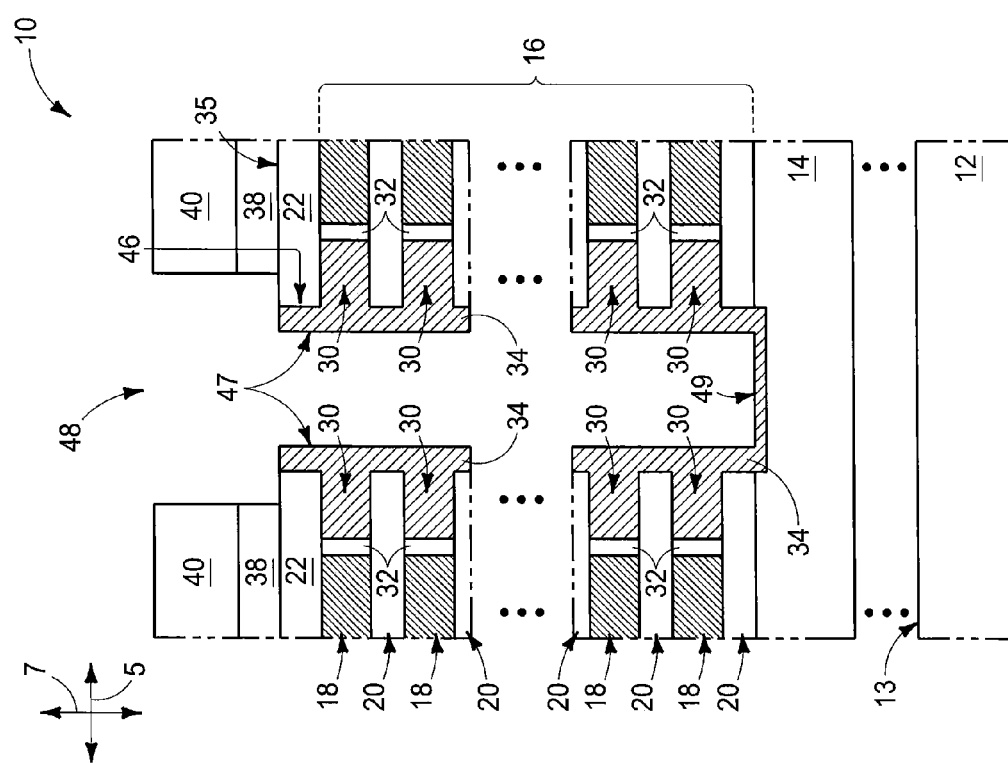

Referring to FIG. 7, the oxide material 40 and second hardmask material 38 are patterned to form a third opening 48 which is wider than the second opening 44 (FIG. 6). Such patterning may comprise any suitable processing, including, for example, utilization of a mask (not shown) to define the width of opening 48, followed by an etch through materials 38 and 40, followed by removal of the mask to leave the construction of FIG. 7. In the shown embodiment, hardmask material 22 has not been etched during the etching of hardmask material 38. Such may occur if materials 22 and 38 are different from one another. However, in some embodiments materials 22 and 38 may be a same composition as one another, and in such embodiments the etching utilized to form the third opening 48 may remove some of material 22 to form a divot (not shown) within material 22 adjacent the container 46.

Figure 8:
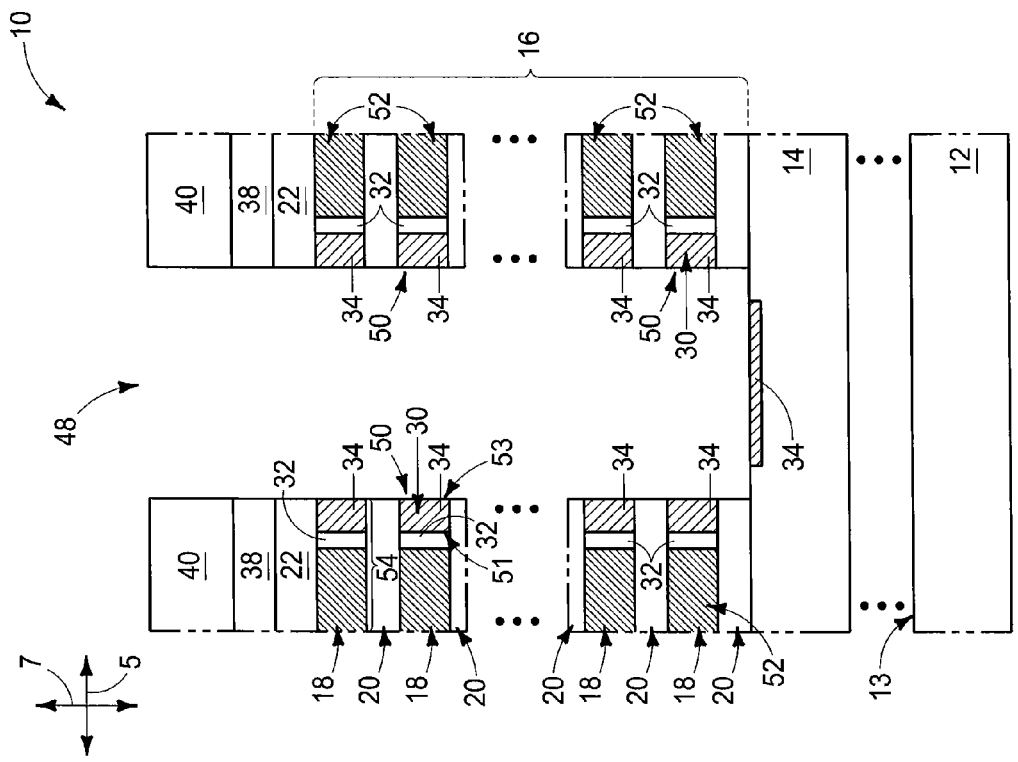

Referring to FIG. 8, opening 48 is extended into the fill material 34, which removes the sidewalls 47 (FIG. 7) of upwardly-opening container 46 (FIG. 7), while leaving fill material 34 within cavities 30 as vertically-stacked structures. The fill material remaining within the cavities may form vertically-stacked charge-storage structures 50 (only some of which are labeled) in some embodiments. In such embodiments, regions of conductive levels 18 may correspond to control gates 52 (only some of which are labeled) which are spaced from charge-storage structures 50 by blocking dielectric material 32. The combined control gates, charge-storage structures, and blocking dielectric material may together form a plurality of memory cells 54 (only one of which is labeled). In some embodiments, such memory cells may be NAND gates.

In the shown embodiment, each of the charge-storage structures 50 has a first side 51 (only one of which is labeled) against blocking dielectric material 32, and a second side 53 (only one of which is labeled) along the opening 48.

In the shown embodiment, some of the fill material 34 remains along the bottom of opening 48; and specifically remains inset within a recess extending into material 14. In other embodiments, the opening 48 may be extended to a sufficient depth so that none of material 34 remains along a bottom of the opening. In some embodiments, the recess in material 14 may not be formed at the processing stage of FIG. 2, and accordingly a construction analogous to that of FIG. 8 will not have such recess to retain material 34.

Figure 9:
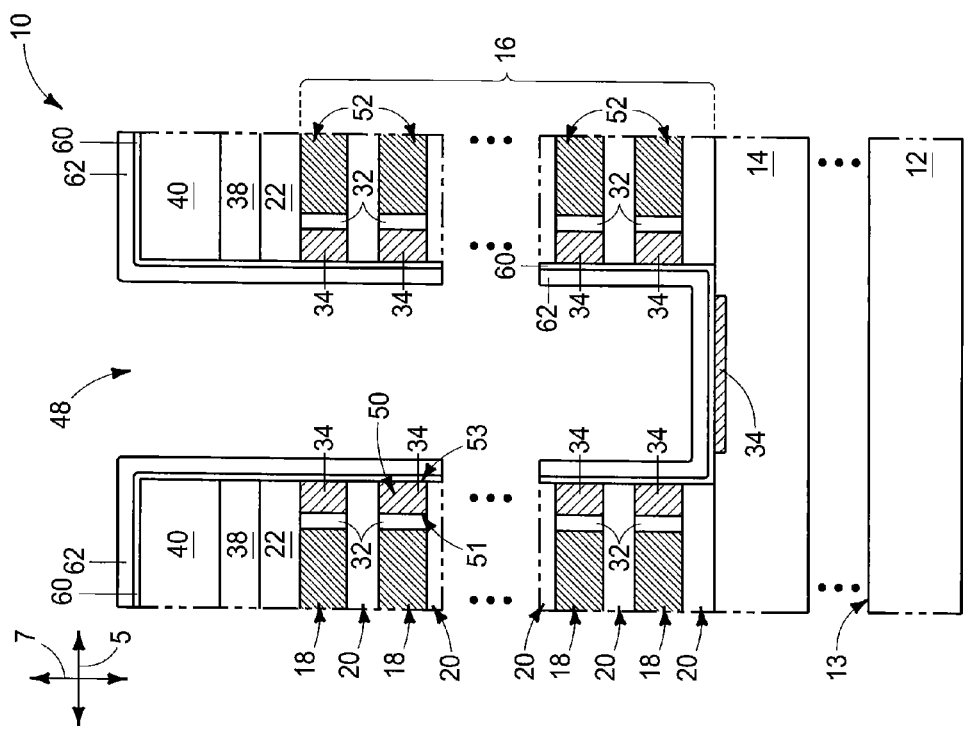

Referring to FIG. 9, gate dielectric material 60 is formed over oxide 40 and within opening 48. The gate dielectric material extends along the sides 53 (only one of which is labeled) of charge-storage structures 50 (only one of which is labeled).

The gate dielectric material may comprise any suitable composition or combination of compositions; and in some embodiments may comprise, consist essentially of, or consist of one or more of silicon dioxide, hafnium oxide, zirconium oxide, aluminum oxide, etc. In the shown embodiment, the gate dielectric material lines sidewalls of opening 48, and accordingly may be referred to as a gate dielectric liner. In other embodiments, the gate dielectric material may be selectively formed along exposed surfaces of material 34 (and possibly also along exposed surfaces of material 18) by, for example, oxidizing such surfaces.

A protective material 62 is formed over gate dielectric material 60. The protective material may comprise any suitable composition, and in some embodiments may comprise, consist essentially of, or consist of silicon (for instance, polycrystalline silicon).

The protective material 62 lines opening 48, and in some embodiments may be referred to as a protective liner.

The materials 60 and 62 narrow the opening 48.

Figure 10:
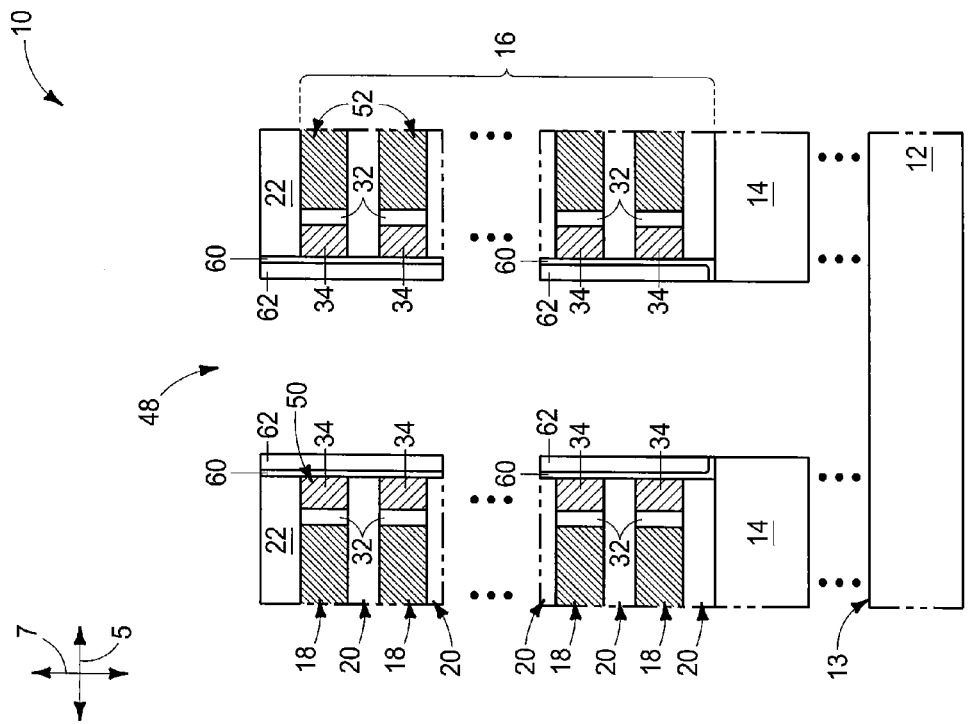

Referring to FIG. 10, the narrowed opening 48 is extended through material 14 with an anisotropic etch. Such etch also removes oxide material 40 (FIG. 9), and the portions of materials 60 and 62 that had been over such oxide material. In the shown embodiment, the anisotropic etch also removes hardmask material 38 (FIG. 9), and in some embodiments may remove at least some of hardmask material 22. For instance, in some embodiments both of hardmask materials 22 and 38 comprise silicon nitride, and in such embodiments the anisotropic etching may remove all of material 38, and at least about half of material 22. In some embodiments, material 22 may be utilized as a CMP etch stop.

Although the etch of FIG. 10 is shown to punch entirely through material 14, in other embodiments the etch that extends narrowed opening 48 into material 14 may only punch partially through material 14, and a remainder of material 14 may be removed from a bottom of the narrowed opening with a subsequent etch that removes protective material 62 (such subsequent etch is discussed below with reference to FIG. 11).

The anisotropic etch of FIG. 10 may utilize any suitable chemistry, or combination of chemistries. For instance, in some embodiments such etch may utilize one or more halogen-based chemistries.

Figure 11:
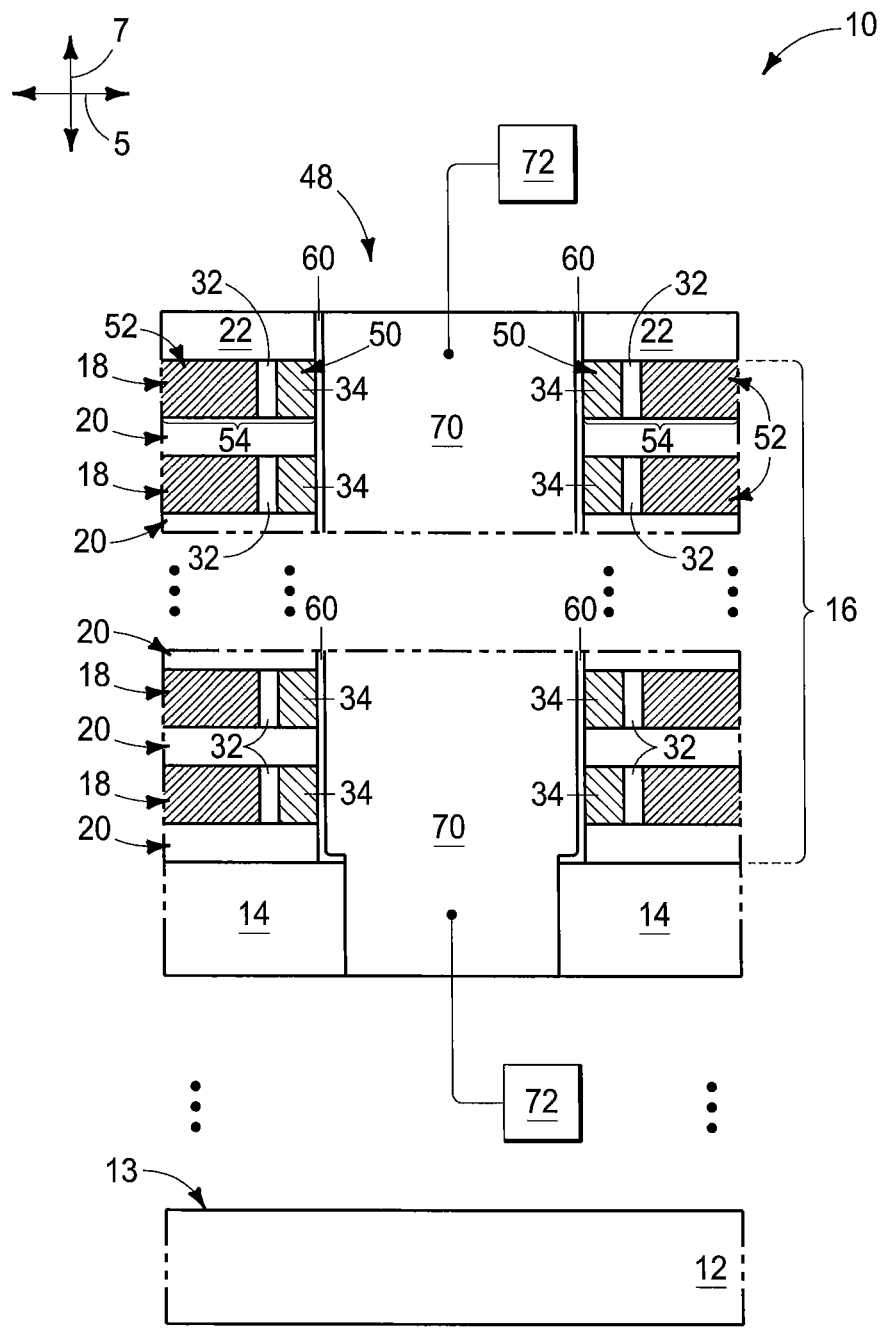

Referring to FIG. 11, protective material 62 (FIG. 10) is removed to expose gate dielectric material 60, and subsequently channel material 70 is formed within opening 48 and along the gate dielectric material 60. The channel material 70 may comprise any suitable composition, or combination of compositions, and in some embodiments may comprise, consist essentially of, or consist of appropriately-doped silicon.

The memory cells 54 (only one of which is labeled) are along the channel material, with the charge-storage structures 50 (only some of which are labeled) being spaced from the channel material by the gate dielectric material 60. In operation, the memory cells 54 may be incorporated into vertical memory cell strings. In some embodiments, the vertical memory cell strings are NAND strings of memory cells. Such NAND strings of memory cells may be connected to NAND select gates (for instance, NAND drain side select gates and NAND source side select gates) which are provided above and below the strings of memory cells; and may thus be incorporated into NAND unit cells. In the shown embodiment, a NAND drain side select gate 72 is diagrammatically illustrated as being electrically interconnected with a top of a channel region comprising channel material 70, and a NAND source side select gate 72 is directly illustrated as being electrically interconnected with a bottom of such channel region. In some embodiments, a plurality of NAND unit cells may be formed across a semiconductor substrate to form a NAND memory array. The memory array may be incorporated into an electronic system. Such electronic system may be used in, for example, memory modules, device drivers, power modules, communication modems, processor modules, and application-specific modules, and may include multilayer, multichip modules. The electronic system may be any of a broad range of systems, such as, for example, clocks, televisions, cell phones, personal computers, automobiles, industrial control systems, aircraft, etc.

The terms "dielectric" and "electrically insulative" are both utilized to describe materials having insulative electrical properties. Both terms are considered synonymous in this disclosure. The utilization of the term "dielectric" in some instances, and the term "electrically insulative" in other instances, is to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a method of forming vertically-stacked structures. A first hardmask material is formed over a stack of alternating electrically conductive levels and electrically insulative levels. A first opening is formed through the first hardmask material, and then extended through the stack. The electrically conductive levels are etched along sidewalls of the first opening to form cavities extending into the electrically conductive levels. A fill material is formed within the first opening and within the cavities. A second hardmask material is formed over the first hardmask material and over the fill material. A second opening is formed through the second hardmask material. The second opening is narrower than the first opening. The second opening is extended into the fill material to form an upwardly-opening container from the fill material. Sidewalls of the upwardly-opening container are removed, while leaving the fill material within the cavities as a plurality of vertically-stacked structures.

Some embodiments include a method of forming a construction comprising vertically-stacked memory cells. A stack of alternating electrically conductive levels and electrically insulative levels is formed over a semiconductor base. A first hardmask material is formed over the stack. A first opening is formed through the first hardmask material. The first opening is extended through the stack. Cavities are formed to extend into the electrically conductive levels along sides of the first opening. Blocking dielectric material is formed along exposed edges of the electrically conductive levels within the cavities. A fill material is formed within the first opening and within the cavities. The fill material comprises a charge-storage material. A second hardmask material is formed over the first hardmask material and over the fill material. A second opening is formed through the second hardmask material, the second opening being narrower than the first opening. The second opening is extended into the fill material to form an upwardly-opening container from the fill. The second hardmask material is patterned to form a third opening which is wider than the second opening. The third opening is extended into the fill material to remove sidewalls of the upwardly-opening container while leaving the fill material within the cavities as charge-storage. The charge-storage structures have first sides against the blocking dielectric material and have second sides along the third opening. Gate dielectric is formed along the second sides of the charge-storage structures. Channel material is formed along the gate dielectric and spaced from the charge-storage structures by the gate dielectric.

Some embodiments include a method of forming a construction comprising vertically-stacked memory cells. A stack of alternating electrically conductive levels and electrically insulative levels is formed over an etchstop material. A first hardmask material is formed over the stack. A first opening is formed through the first hardmask material. The first opening is extended through the stack to at least an upper surface of the etchstop material. Cavities are formed to extend into the electrically conductive levels along sides of the first opening. Blocking dielectric material is formed along exposed edges of the electrically conductive levels within the cavities. A fill material is formed within the first opening and within the cavities. The fill material comprises a charge-storage material. A second hardmask material is formed over the first hardmask material and over the fill material. An oxide material is formed over the second hardmask material. A second opening is formed to extend through the oxide material and the second hardmask material. The second opening is narrower than the first opening. The second opening is extended into the fill material to form an upwardly-opening container from the fill material. The oxide material and the second hardmask material are patterned to form a third opening which is wider than the second opening. The third opening is extended into the fill material to remove sidewalls of the upwardly-opening container while leaving the fill material within the cavities as charge-storage structures. The charge-storage structures have first sides against the blocking dielectric material and have second sides along the third opening. A gate dielectric liner is formed along sides of the third opening. A protective liner is formed over the gate dielectric liner and over the oxide. The oxide and protective liner thereover are removed with an anisotropic etch while leaving the protective liner within the third opening. The anisotropic etch punches at least partially through the etchstop material. The protective liner is removed. After the protective liner is removed, the third opening is filled with channel material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a construction comprising vertically-stacked memory cells, the method comprising:
   forming a stack of alternating electrically conductive levels and electrically insulative levels over a semiconductor base;
   forming a first hardmask material over the stack;
   forming a first opening through the first hardmask material;
   extending the first opening through the stack;
   forming cavities extending into the electrically conductive levels along sides of the first opening;
   forming blocking dielectric material along exposed edges of the electrically conductive levels within the cavities;
   forming a fill material within the first opening and within the cavities; the fill material comprising a charge-storage material;
   forming a second hardmask material over the first hardmask material and over the fill material;
   forming a second opening through the second hardmask material, the second opening being narrower than the first opening;
   extending the second opening into the fill material to form an upwardly-opening container from the fill material;
   patterning the second hardmask material to form a third opening which is wider than the second opening;
   extending the third opening into the fill material to remove sidewalls of the upwardly-opening container while leaving the fill material within the cavities as charge-storage structures; the charge-storage structures having first sides against the blocking dielectric material and having second sides along the third opening;
   forming gate dielectric along the second sides of the charge-storage structures; and
   forming channel material along the gate dielectric and spaced from the charge-storage structures by the gate dielectric.

2. The method of claim 1 further comprising forming carbon-containing material over the first hardmask material; and wherein:
   the carbon-containing material is patterned with the first hardmask material to form the first opening to extend through both the carbon-containing material and the first hardmask material; and
   the carbon-containing material is removed during the extending of the first opening through the stack.

3. The method of claim 2 wherein the carbon-containing material consists of carbon.

4. The method of claim 1 wherein the fill material comprises doped or undoped silicon.

5. The method of claim 1 wherein the fill material entirely fills the opening.

6. The method of claim 1 wherein the fill material substantially entirely fills the opening, except for a vertically-extending seam extending down a central region of the fill material.

7. A method of forming a construction comprising vertically-stacked memory cells, the method comprising:
   forming a stack of alternating electrically conductive levels and electrically insulative levels over an etchstop material;
   forming a first hardmask material over the stack;
   forming a first opening through the first hardmask material;
   extending the first opening through the stack to at least an upper surface of the etchstop material;
   forming cavities extending into the electrically conductive levels along sides of the first opening;
   forming blocking dielectric material along exposed edges of the electrically conductive levels within the cavities;
   forming a fill material within the first opening and within the cavities; the fill material comprising a charge-storage material;
   forming a second hardmask material over the first hardmask material and over the fill material;
   forming an oxide material over the second hardmask material;
   forming a second opening to extend through the oxide material and the second hardmask material, the second opening being narrower than the first opening;
   extending the second opening into the fill material to form an upwardly-opening container from the fill material;

patterning the oxide material and the second hardmask material to form a third opening which is wider than the second opening;

extending the third opening into the fill material to remove sidewalls of the upwardly-opening container while leaving the fill material within the cavities as charge-storage structures; the charge-storage structures having first sides against the blocking dielectric material and having second sides along the third opening;

forming a gate dielectric liner along sides of the third opening;

forming a protective liner over the gate dielectric liner and over the oxide;

removing the oxide and protective liner thereover with an anisotropic etch, while leaving the protective liner within the third opening; the anisotropic etch punching at least partially through the etchstop material;

removing the protective liner; and after removing the protective liner; filling the third opening with channel material.

8. The method of claim 7 wherein the charge-storage material comprises silicon.

9. The method of claim 7 wherein the charge-storage material comprises charge-trapping material.

10. The method of claim 7 wherein the oxide comprises silicon dioxide.

11. The method of claim 10 wherein the silicon dioxide is formed to a thickness within a range of from about 2000 Å to about 9000 Å.

12. The method of claim 7 wherein the first opening is extended partially through the etchstop material.

13. The method of claim 7 wherein the etchstop material comprises aluminum oxide.

14. The method of claim 7 further comprising forming carbon-containing material over the oxide; and wherein:

the second opening is formed to extend through the carbon-containing material, the oxide and the second hardmask material; and the carbon-containing material is removed during the extending of the second opening into the fill material.

15. The method of claim 14 wherein the carbon-containing material consists of carbon.

* * * * *